(12) United States Patent
Khlat et al.

(10) Patent No.: US 9,929,761 B2
(45) Date of Patent: Mar. 27, 2018

(54) HIGH BAND TDD ANTENNA SWAPPING METHOD WITH IMPROVED RECEIVER SENSITIVITY

(71) Applicant: RF Micro Devices, Inc., Greensboro, NC (US)

(72) Inventors: Nadim Khlat, Midi-Pyrenees (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 106 days.

(21) Appl. No.: 15/062,693

(22) Filed: Mar. 7, 2016

(65) Prior Publication Data

US 2016/0308576 A1 Oct. 20, 2016

Related U.S. Application Data

(60) Provisional application No. 62/148,838, filed on Apr. 17, 2015.

(51) Int. Cl.
| | |
|---|---|
| H04W 4/00 | (2009.01) |
| H04B 1/18 | (2006.01) |
| H04L 5/14 | (2006.01) |
| H04B 1/04 | (2006.01) |

(52) U.S. Cl.
CPC .......... H04B 1/18 (2013.01); *H03F 2200/294* (2013.01); *H03F 2200/451* (2013.01); *H04B 1/0458* (2013.01); *H04B 2001/0408* (2013.01); *H04L 5/1469* (2013.01)

(58) Field of Classification Search
None
See application file for complete search history.

(56) References Cited

U.S. PATENT DOCUMENTS

| | | | | |
|---|---|---|---|---|
| 9,226,295 B2* | 12/2015 | Negus | ................ | H04W 76/025 455/293 |
| 2008/0238802 A1* | 10/2008 | Fukushima | .......... | H01Q 1/3275 343/841 |
| 2013/0295984 A1* | 11/2013 | Todoroki | ............. | H04B 7/0452 455/550.1 |
| 2014/0287704 A1* | 9/2014 | Dupuy | ................ | H04B 1/0475 455/114.2 |
| 2015/0280654 A1* | 10/2015 | Kehrer | ..................... | H03F 1/26 455/293 |

\* cited by examiner

*Primary Examiner* — Anh-Vu Ly
(74) *Attorney, Agent, or Firm* — Withrow & Terranova, P.L.L.C.

(57) ABSTRACT

This disclosure relates to radio frequency (RF) front end circuitry for portable communication devices. In one embodiment, the RF front end circuitry includes an antenna, a switchable receive path configured to be opened and to be closed, a coaxial cable, and a low noise amplifier (LNA). The LNA is coupled so as to drive the coaxial cable. Thus, when the switchable receive path is closed, an RF receive signal received by the antenna can propagate through the switchable receive path to the LNA. Since the LNA is driving the coaxial cable, the RF receive signal can propagate through the coaxial cable without being excessively degraded. In this manner, embodiments of the RF front end circuitry can be utilized to provide antenna swapping and RF transceiver circuitry coupled to the coaxial cable can receive the RF receive signal from the coaxial cable without excessive degradation.

21 Claims, 13 Drawing Sheets

HIGH BAND TDD ANTENNA SWAPPING METHOD WITH IMPROVED RECEIVER SENSITIVITY

RELATED APPLICATIONS

This application claims the benefit of provisional patent application Ser. No. 62/148,838, filed Apr. 17, 2015, the disclosure of which is hereby incorporated herein by reference in its entirety.

FIELD OF THE DISCLOSURE

This disclosure relates generally to radio frequency (RF) front end circuitry for portable communication devices and methods of operating the same.

BACKGROUND

Recently, smart phones have been designed in order to swap between antennas provided within oppositely disposed sections of the smart phone. This allows the smart phone to select the best antenna for RF communication given as conditions change (e.g., user's hand is blocking one antenna more than another antenna relative to the base station). However, in this case, since the antennas are in oppositely disposed sections of the smart phone, the RF signals may sometimes have to be transmitted a few hundred millimeters through the smart phone between RF transceiver circuitry and the selected antenna. Furthermore, recent radio frequency (RF) communication standards require that RF signals operate within high frequency ranges. For example, RF signals formatted in accordance with Long Term Evolution (LTE)-Time Division Duplex (TDD) bands such as band 42, band 43, or License Assisted Access (LAA) are in RF communication bands between 3.5 GHz to 5.5 GHz. At these high frequencies, RF receiver signals can experience significant degradation and large insertion losses when having to propagate a few hundred millimeters between the antenna used for reception and the RF receive chains that process the RF receive signals. Typical receive chains are often not sufficiently sensitive and manufacturing RF receive chains with the sensitivity need to process these degraded RF receive signals at these frequency ranges is costly.

Thus, circuitry for smart phones and other portable communication devices are need that allow for antenna swapping but provide for less degradation and lower insertion losses of RF signals.

SUMMARY

This disclosure relates to radio frequency (RF) front end circuitry for portable communication devices that reduces insertion losses and prevents signal degradation. In one embodiment, the RF front end circuitry of portable communication device includes an antenna, a switchable receive path configured to be opened and to be closed, a coaxial cable, and a low noise amplifier (LNA) having an input LNA port and an output LNA port. The switchable receive path is coupled to the antenna. As such, an RF receive signal received by the antenna can propagate through the switchable receive path when the switchable receive path is closed. The LNA is coupled between the switchable receive path and the coaxial cable. More specifically, the input LNA port of the LNA is coupled to the switchable receive path, and the output LNA port of the LNA is coupled to the coaxial cable. In this manner, the LNA is coupled to the coaxial cable so that the LNA drives the coaxial cable. Accordingly, when the switchable receive path is closed, the LNA amplifies the RF receive signal, and the RF receive signal propagates through the coaxial cable after amplification by the LNA. By providing this boost to the RF receive signal, the RF receive signal can propagate through the coaxial cable without being excessively degraded. In this manner, embodiments of the RF front end circuitry can be utilized to provide antenna swapping, and RF transceiver circuitry coupled to the coaxial cable can receive the RF receive signal without excessive degradation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
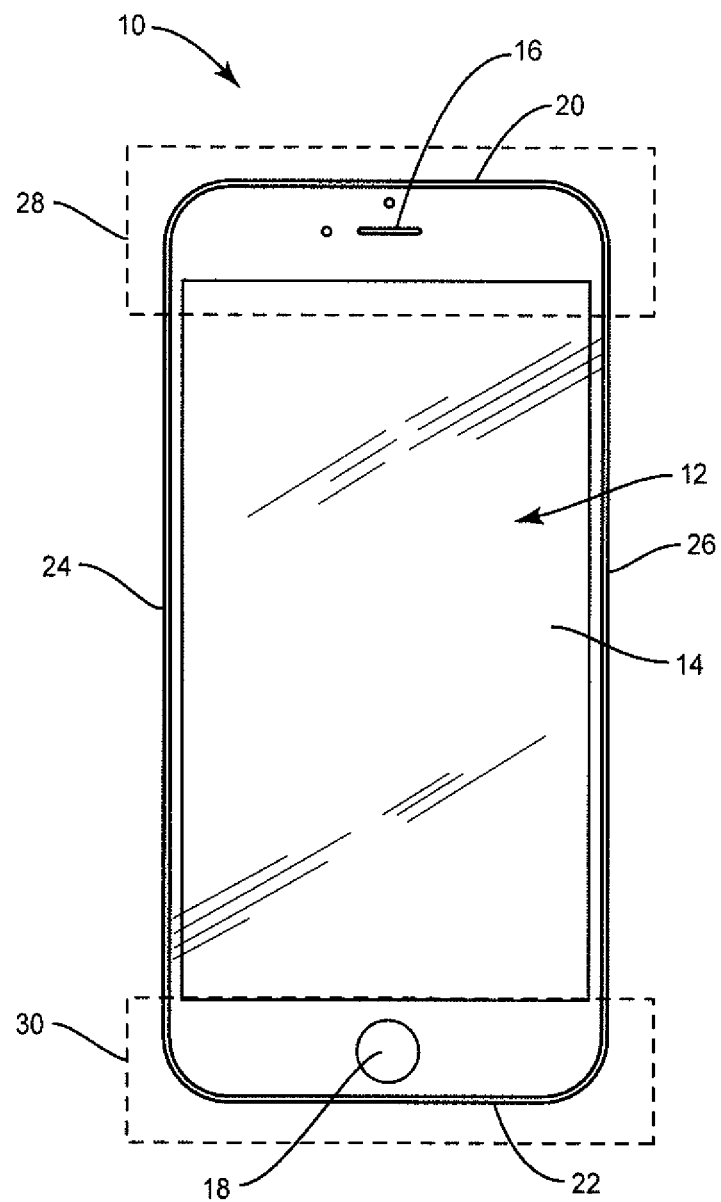
FIG. 1 illustrates one embodiment of a portable communication device externally and from a user interface side.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Throughout this disclosure, relative terminology, such as "approximately," "substantially," and the like, may be used in a predicate to describe features and relationships between features of a device or method. The relative terminology in the predicate should be interpreted sensu lato. However, whether the predicate employing the relative terminology is satisfied is determined in accordance with error ranges and/or variation tolerances relevant to the predicate and prescribed to the device or method by radio frequency (RF) communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced or inferred.

With regard to the term "port," a port refers to any component or set of components configured to input and/or output RF signals. To illustrate, a port may be provided as a node, pin, terminal, contact, connection pad, and/or the like or a set of the aforementioned components. For example, with regard to a single-ended signal, a port may be provided by a single node or a single terminal. However, in other embodiments for a differential signal, a port may be provided by a pair of terminals or nodes configured to receive and/or transmit differential signals.

It should be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It should also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that, although the terms "upper," "lower," "bottom," "intermediate," "middle," "top," and the like may be used herein to describe various elements, these elements should not be limited by these terms. These terms are only used to distinguish one element from another. For example, a first element could be termed an "upper" element and, similarly, a second element could be termed an "upper" element depending on the relative orientations of these elements, without departing from the scope of the present disclosure.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having meanings that are consistent with their meanings in the context of this specification and the relevant art and will not be interpreted in an idealized or overly formal sense unless expressly so defined herein.

This disclosure relates generally to portable communication devices with Radio Frequency (RF) front end circuitry capable of providing antenna swapping. For example, embodiments of RF front end circuitry in a portable communication device may include two different antennas in oppositely disposed sections of the portable communication device. The RF front end circuitry allows for antenna swapping between the antennas so that any one of the antennas may be selected to transmit and/or emit RF signals. The RF front end circuitry may include RF transceiver circuitry that generates RF transmission signals to be emitted wirelessly by the selected antenna and that processes RF receive signals received by the selected antenna. Generally, the RF transceiver circuitry is provided within one of the oppositely disposed sections so that one of the antennas is much closer to the RF transceiver circuitry than the more distant antenna. To implement Time Division Duplex (TTD) operation modes, embodiments of the RF front end circuitry may include simplified switching and filtering circuitry that allows for switching between RF transmission and RF reception regardless of which of the antennas is selected. One or more coaxial cables may be provided so that RF signals can be transmitted between the more distant antenna and the RF transceiver circuitry.

However, embodiments of the RF front end circuitry in the exemplary portable communication devices also include circuitry that can be used to reduce insertion losses and prevent significant degradation of RF signals when the more distant antenna has been selected. More specifically, one or more coaxial cables may be provided so that an RF signal can propagate between the more distant antenna and the RF transceiver circuitry. The RF front end module includes amplification circuitry to drive the coaxial cable(s) and thereby prevent the RF signal from degrading. For example, when the more distant antenna is selected for reception of an RF receive signal, the RF front end module has a low noise amplifier (LNA) that drives the coaxial cable that transmits the RF receive signal to the RF transceiver circuitry. Thus, even though the RF receive signal may have to travel a few hundred millimeters through the coaxial cable to reach the RF transceiver circuitry, the RF receive signal receives a boost by the LNA, which is driving the coaxial cable. The LNA thereby reduces insertion losses and prevents the RF receive signal from experiencing significant degradation. This thereby reduces the sensitivity requirements of the RF transceiver circuitry that processes the RF receive signal.

FIG. 1 illustrates one embodiment of a portable communication device 10, which may include an embodiment of the RF front end circuitry described above and as further explained in detail below. This exemplary embodiment of the portable communication device 10 is a user smart phone and more specifically is an iPhone 6S® manufactured by Apple®. However, the portable communication device 10 may be any type of mobile user device capable of establishing communications through at least one type of wireless network. For example, the portable communication device may be a cellular phone, a tablet, a portable computer, a personal digital assistant (PDA), a portable monitor, a portable television, a portable radio, a portable music player, a portable video player, and/or the like regardless of the manufacturer of the portable communication device 10.

As shown in FIG. 1, the portable communication device 10 has a user interface side 12, which in this embodiment may be considered the front side of the portable communication device 10. The user interface side 12 provides access to user interface components for receiving input from the user and displaying output to the user. In this embodiment, the portable communication device 10 includes a touch screen 14, a speaker 16, a microphone (not explicitly shown), and a home button 18. Although other user interface components may be provided access at other sides of the portable communication device 10, the user interface side 12 provides access to the user interface components since it is designed to face the user during typical operations.

The portable communication device 10 also has an edge side 20, an edge side 22, an edge side 24, and an edge side 26. The user interface side 12 is bordered by the edge side 20, the edge side 22, the edge side 24, and the edge side 26. The edge side 20 and edge side 22 are parallel but oppositely disposed to one another. The edge side 24 and edge side 26 are also parallel but oppositely disposed to one another. However, the edge side 24 and the edge side 26 are both transverse to the edge side 20 and the edge side 22. The speaker 16 audibly projects sound during a telephone call and is thus designed to be placed near the user's ear during the telephone call. A top section 28 of the portable communication device 10 is thus bordered and is closer to the edge side 20 of the user interface side 12. The user speaks into the microphone (not explicitly shown) which is designed to receive audible sounds from the user's mouth during a telephone call. A bottom section 30 of the portable communication device 10 is thus bordered and is closer to the edge side 22 of the user interface side 12. The top section 28 and the bottom section 30 are thus oppositely disposed from one another.

When the user is operating the portable communication device 10, the relative position and orientation of the user, a network antenna, and the portable communication device 10 may change as the user changes positions or moves parts of their body. For example, during a telephone call, the user may move, change hand positions, or turn his face. The portable communication device 10 includes at least two antennas (not shown in FIG. 1) as explained in further detail below. For example, one antenna may be provided in the top section 28 closer to the edge side 20 of the user interface side 12. The other antenna may be provided in the bottom section 30 closer to the edge side 22 of the user interface side 12. As explained in further detail below, the portable communication device 10 includes RF front end circuitry that allows for antenna swapping where reception and/or emission of RF signals can be either from the antenna in the top section 28 or the antenna in the bottom section 30 depending on which antenna offers the best radiation efficiency based on the current operational conditions (for example, the user's hand is hiding one antenna versus another one, for example). Additionally or alternatively, antennas may be placed at opposite sides of the portable communication device that border and are closer to the edge side 24 and the edge side 26. The user interface side 12 may be considered the front side of the portable communication device 10.

Figure 2:
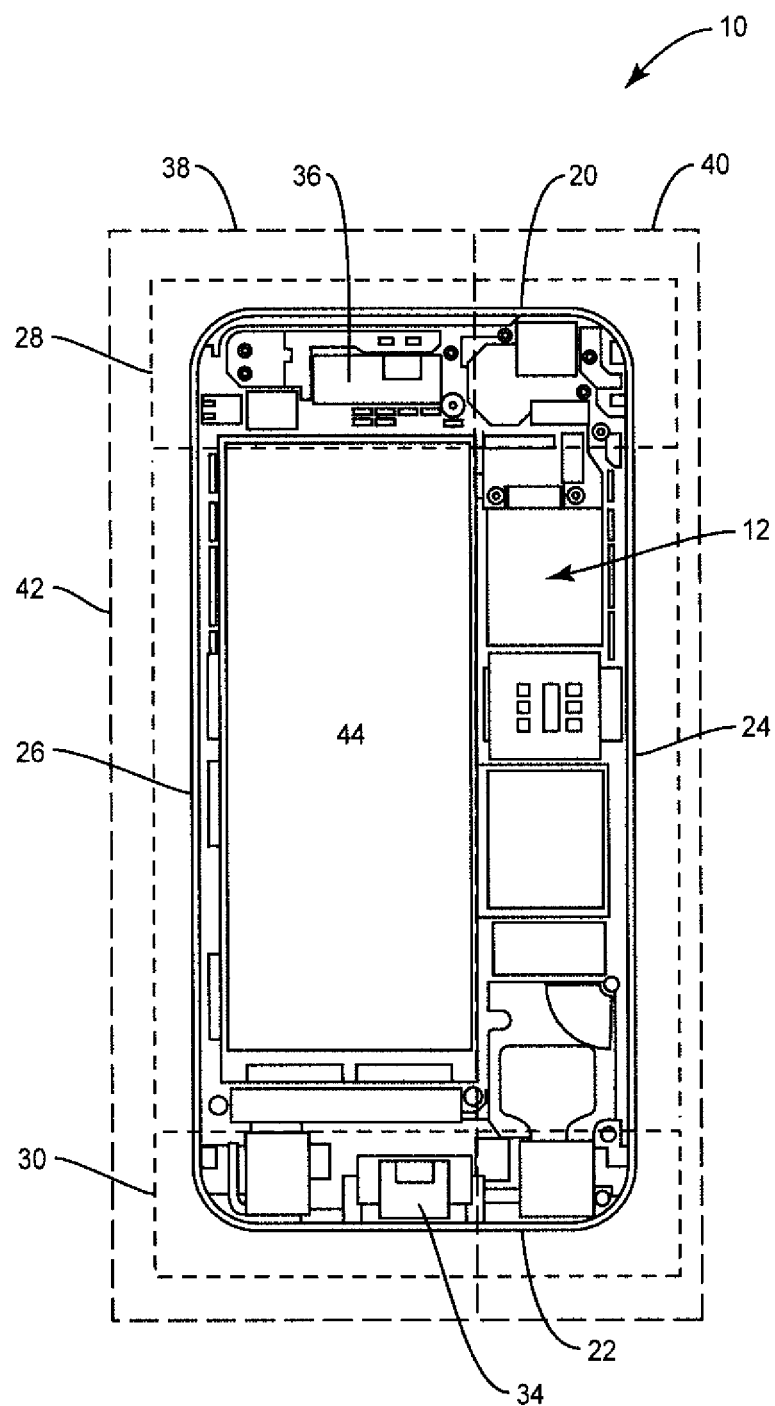
FIG. 2 illustrates the portable communication device shown in FIG. 1 internally from a support side of the portable communication device where the portable communication device includes an antenna in the bottom section and an antenna in the top section of the portable communication device.

FIG. 2 illustrates the portable communication device 10 shown in FIG. 1 internally from a support side 32 of the portable communication device 10 opposite the user interface side 12. An external surface of the support side 32 is generally covered by the housing of the portable communication device 10 and is utilized to support the portable communication device 10 (e.g., with the user's hand or against a surface) so that the user interface side 12 (shown in FIG. 1) faces the user. The support side 32 may thus be considered a back side of the portable communication device 10. The portable communication device 10 includes an antenna 34 in the bottom section 30 of the portable communication device 10. The portable communication device 10 also includes the antenna 36. The antenna 36 is in the top section 28 of the portable communication device 10, wherein the top section 28 is oppositely disposed from the bottom section 30 having the antenna 34. Therefore the antennas 34, 36 are each in oppositely disposed sections 28, 30, thereby allowing the portable communication device 10 to provide for antenna swapping depending on which of the antennas 34, 36 offers the best radiation efficiency based on the current operational conditions.

As shown from the support side 32 of the portable communication device 10, the portable communication device 10 has a lateral section 38 and a lateral section 40. The lateral section 38 of the portable communication device 10 is bordered and is closer to the edge side 26 of the user interface side 12. The lateral section 40 of the portable communication device 10 is bordered and is closer to the edge side 24 of the user interface side 12. The lateral section 38 and the lateral section 40 are thus oppositely disposed from one another. Between the top section 28 and the bottom section 30 of the portable communication device 10 is an intermediate section 42 of the portable communication device 10. A battery 44 is provided in the lateral section 38 of the portable communication device 10 between the top section 28 and the bottom section 30. Thus, the battery 44 is also in the intermediate section 42 of the portable communication device 10. The battery 44 provides a power source voltage, in this case a battery voltage.

Figure 3:
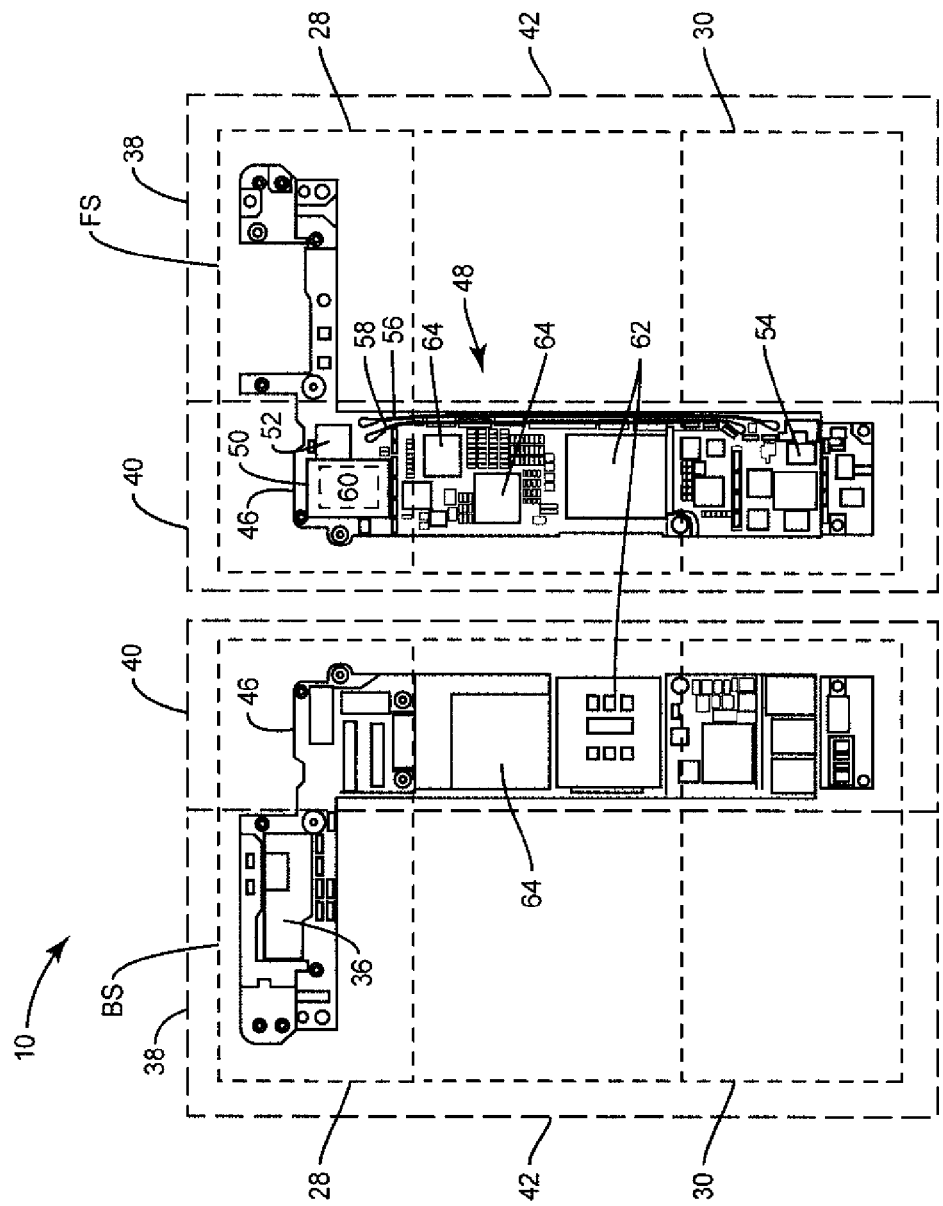
FIG. 3 illustrates one embodiment of a printed circuit board in the portable communication device shown in FIG. 1, where the portable communication device includes radio frequency (RF) transceiver circuitry and an integrated circuit (IC) package in the top section, another IC package in the bottom section, and coaxial cables that extend between the top section and the bottom section.

FIG. 3 illustrates one embodiment of a printed circuit board 46 that is provided in the lateral section 38 and the lateral section 40 of the portable communication device 10. The printed circuit board 46 is internal to the portable communication device 10. The printed circuit board 46 is designed to fit around the battery 44 (shown in FIG. 3). A front side FS of the printed circuit board 46 and a back side BS of the printed circuit board 46 are shown in FIG. 3. The front side FS faces the user interface side 12 (shown in FIG. 1) while the back side BS faces the support side 32 (shown in FIG. 2). The printed circuit board 46 extends from the top section 28, the intermediate section 42, and the bottom section 30 of the portable communication device 10. The portable communication device 10 includes RF front end circuitry 48 that is configured to transmit to and/or receive information from one or more wireless communication networks. The RF front end circuitry 48 includes the antenna 34 (shown in FIG. 2), the antenna 36, an integrated circuit (IC) package 50, an IC package 52, an IC package 54, a coaxial cable 56, a coaxial cable 58, and RF transceiver circuitry 60. The IC package 50 is in the top section 28 and includes RF transceiver circuitry 60. The RF transceiver circuitry 60 includes transmit chains for generating RF transmission signals that are emitted from the antennas 34, 36 and receive chains for processing RF receive signals where reception of the RF receive signals is provided by the antennas 34, 36.

The portable communication device 10 includes RF front end circuitry 48 that is configured to transmit to and/or receive information from one or more wireless communication networks. The RF front end circuitry 48 includes the antenna 34, the antenna 36, an IC package 50, an IC package 52, an IC package 54, a coaxial cable 56, and a coaxial cable 58.

The IC package 50 is in the top section 28 and includes RF transceiver circuitry 60. The RF transceiver circuitry 60 includes transmit chains for generating RF transmission signals that are emitted from the antennas 34, 36 and receive chains for processing RF receive signals where reception of the RF receive signals is provided by the antennas 34, 36.

Thus, the RF transceiver circuitry 60 may include transmit chains and receive chains for RF signals within different RF communication bands, to be formatted in accordance with different RF communication standards, and/or to be provided in accordance with different RF communication specifications within those RF communication standards. Exemplary RF communication standards and specifications include a 2G Global System for Mobile Communications (GSM) standard (e.g., a Digital Communication System (DCS) specification or a Personal Communications Service (PCS) specification), GSM specifications, Enhanced Data Rates for GSM Evolution (EDGE) specifications of the 3G standard, and/or different specifications of the Long Term Evolution (LTE) standard. Furthermore, the RF signals can be multiplexed in accordance with Time Division Duplex (TDD) techniques, Frequency Division Duplex (FDD) techniques, Space Division Multiplexing (SDM), Code Division Multiple Access (CDMA) multiplexing, Orthogonal Frequency Division Multiple Access (OFDMA) multiplexing, LTE diversity techniques, Multiple-Input and Multiple-Output (MIMO) techniques, and/or the like.

With regard to TDD multiplexing, the IC package 52 includes circuitry that allows for an RF receive signal to be received wirelessly by the antenna 36 and for an RF transmission signal to be emitted wirelessly by the antenna 36 within different time periods of a TDD time window, as explained in further detail below. The IC package 52 allows for the RF receive signal and the RF transmission signal to be routed to the RF transceiver circuitry 60 housed by the IC package 50. The IC package 52 is also within the top section 28 of the portable communication device 10.

As mentioned above, the portable communication device 10 allows for antenna swapping. Thus, with regard to TDD multiplexing, the IC package 54 includes circuitry that allows for the RF receive signal to be received wirelessly by the antenna 34 and for the RF transmission signal to be emitted wirelessly by the antenna 34 within the different time periods of the TDD time window, as explained in further detail below.

The IC package 54 allows for the RF receive signal and the RF transmission signal to be routed to the RF transceiver circuitry 60 housed by the IC package 50. However, the IC package 54 is within the bottom section 30 of the portable communication device 10 along with the antenna 34. The top section 28 and the bottom section 30 are separated by the intermediate section 42, which is several centimeters long. Thus, to transmit the RF transmission signal from the IC package 54 in the bottom section 30 to the RF transceiver circuitry 60 in the top section 28, the coaxial cable 56 is provided. The coaxial cable 56 extends through the intermediate section 42 and between the top section 28 and the bottom section 30. The coaxial cable 56 has an inner conductor surrounded by insulation, where the insulation is surrounded by a metallic shield. The metallic shield is surrounded by a plastic jacket. The configuration of the coaxial cable 56 allows it to function effectively as a transmission line and is designed so that there is little magnetic and electric leakage outside the metallic shield. To transmit the RF receive signal from the RF transceiver circuitry 60 in the top section 28 to the IC package 54 in the bottom section 30, the coaxial cable 58 is provided. The coaxial cable 58 extends through the intermediate section 42 and between the top section 28 and the bottom section 30. The coaxial cable 58 has an inner conductor surrounded by insulation, where the insulation is surrounded by a metallic shield. The metallic shield is surrounded by a plastic jacket. The configuration of the coaxial cable 58 allows it to function effectively as a transmission line and is designed so that there is little magnetic and electric leakage outside the metallic shield. The coaxial cables 56, 58 thereby reduce significantly the noise that can be introduced within the RF transmission signal and the RF receive signal when the antenna 34 in the bottom section 30 is being used for wireless communication by the portable communication device 10. As explained in further detail below, the IC package 54 is also designed to reduce increase power of the RF receive signal in the bottom section 30 and thereby prevent significant degradation of the RF receive signal prior to reaching the RF transceiver circuitry 60 in the top section 28 of the portable communication device 10. The RF front end circuitry 48 of the portable communication device 10 further includes control circuitry 64 in the intermediate section 42. The portable communication device 10 further includes power regulation circuitry 66 also within the intermediate section 42.

Figure 4:
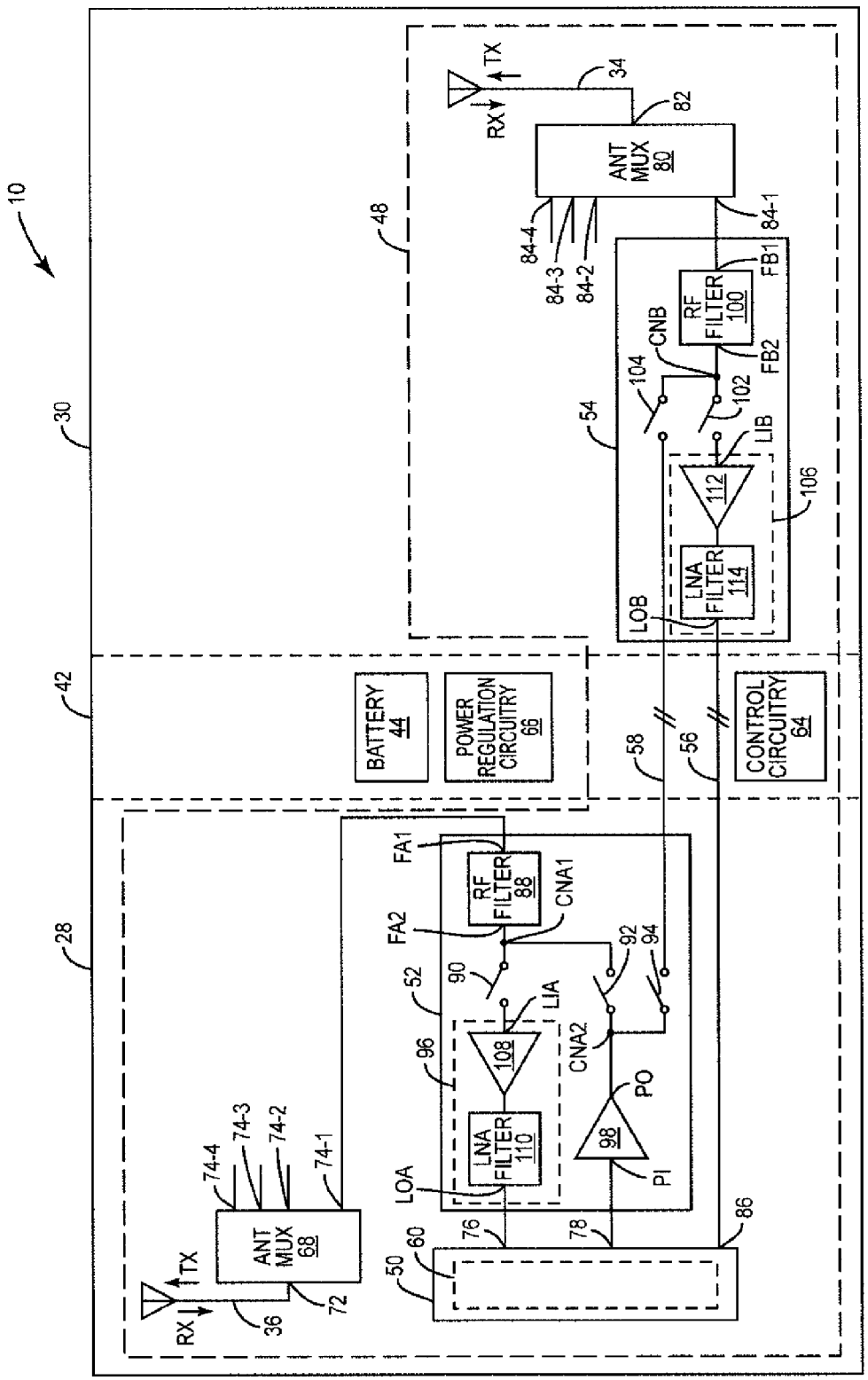
FIG. 4 illustrates the portable electronic device described above in FIGS. 1-3 and an embodiment of the RF front end circuitry described shown in FIG. 3.

FIG. 4 illustrates the portable electronic device 10 described above in FIGS. 1-3 and an embodiment of the RF front end circuitry 48 described above with respect to FIG. 3. In the top section 28 of the portable communication device 10, the RF front end circuitry 48 includes the antenna 36, an antenna multiplexer 68, the IC package 50 that houses the RF transceiver circuitry 60, and the IC package 52. In the bottom section 30 of the portable communication device 10, the RF front end circuitry 48 includes the antenna 34, an antenna multiplexer 80, and the IC package 54. Between the top section 28 and the bottom section 30 and extending through the intermediate section 42, the RF front end circuitry 48 includes the coaxial cable 56, the coaxial cable 58, and the control circuitry 64. The portable communication device 10 also includes the battery 44 and the power regulation circuitry 66 in the intermediate section 42.

The antenna multiplexer 68 in the top section 28 allows for RF signals to be routed to and from the antenna 36 to the RF transceiver circuitry 60. The antenna multiplexer 68 includes an antenna port 72 and multiplexer ports 74-1, 74-2, 74-3, 74-4. The antenna multiplexer 68 is configured so that any one of the multiplexer ports 74-1, 74-2, 74-3, 74-4 is selectable. When any one of the multiplexer ports 74-1, 74-2, 74-3, 74-4 is selected, RF signals can propagate between the antenna port 72 and the selected one of the multiplexer ports 74-1, 74-2, 74-3, 74-4. In this manner, RF signals can propagate between the antenna 36 and the selected one of the multiplexer ports 74-1, 74-2, 74-3, 74-4. With regard to a RF receive signal RX and a RF transmission signal TX and in a first TDD operation mode, the control circuitry 64 is configured to select the multiplexer port 74-1. In this manner, the RF receive signal RX propagates from the antenna 36 through the antenna port 72 to the multiplexer port 74-1. Also, the RF transmission signal TX propagates from the multiplexer port 74-1, to the antenna port 72 and then to the antenna 36.

The RF transmission signal TX and the RF receive signal RX are very high band (VHB) RF signals. For example, the RF transmission signal TX and the RF receive signal RX are provided within band 42, band 43, or License Assisted Access (LAA). In this regard, the RF transmission signal TX may be provided in an RF transmission sub-band while the RF receive signal RX is an RF receive sub-band of the RF communication band wherein the RF transmission sub-band and the RF receive sub-band are both within the RF communication band. VHB RF signals, such as the RF transmission signal TX and the RF receive signal RX are in RF communication bands that are in a frequency range between 3.5 GHz and 5.5 GHz.

When the control circuitry 64 is operating in the first TDD operational mode, the circuitry within the IC package 52 in the top section 28 of the portable communication device 10 is used to route the RF receive signal RX and the RF transmission signal TX to and from the RF transceiver circuitry 60 from and to the antenna 36 during a TDD time window. More specifically, when the control circuitry 64 is operating in the first TDD operational mode and during a receive portion of the TDD time window, reception of the RF receive signal RX is provided by the antenna 36 to antenna port 72. From the antenna port 72, the RF receive signal RX propagates to the multiplexer port 74-1, where the RF receive signal RX is routed by the circuitry in the IC package to an RF port 76 of the RF transceiver circuitry 60. A receive chain within the RF transceiver circuitry 60 processes the RF receive signal RX.

When the control circuitry 64 is operating in the first TDD operational mode and during a transmit portion of the TDD time window, the RF transceiver circuitry has a transmission chain that generates the RF transmission signal TX from the RF port 78 and is then routed by the circuitry within the IC package 52 to the multiplexer port 74-1. From the multiplexer port 74-1, the RF transmission signal TX propagates to the antenna port 72 and is then emitted by the antenna 36.

With regard to the bottom section 30, the antenna multiplexer 80 in the bottom section 30 allows for RF signals to be routed to and from the antenna 34 to the RF transceiver circuitry 60. The antenna multiplexer 80 includes an antenna port 82 and multiplexer ports 84-1, 84-2, 84-3, 84-4. The antenna multiplexer 80 is configured so that any one of the multiplexer ports 84-1, 84-2, 84-3, 84-4 is selectable. When any one of the multiplexer ports 84-1, 84-2, 84-3, 84-4 is selected, RF signals can propagate between the antenna port 82 and the selected one of the multiplexer ports 84-1, 84-2, 84-3, 84-4. In this manner, RF signals can propagate between the antenna 34 and the selected one of the multiplexer ports 84-1, 84-2, 84-3, 84-4. With regard to the RF receive signal RX and the RF transmission signal TX and in a second TDD operation mode, the control circuitry 64 is configured to select the multiplexer port 84-1. In this manner, the RF receive signal RX propagates from the antenna 34 through the antenna port 82 to the multiplexer port 84-1. Also, the RF transmission signal TX propagates from the multiplexer port 84-1 to the antenna port 82 and then to the antenna 34.

When the control circuitry 64 is operating in the second TDD operational mode, the circuitry within the IC package 52 in the top section 28 and the IC package 54 in the bottom section 30 of the portable communication device 10 is used to route the RF receive signal RX and the RF transmission signal TX to and from the RF transceiver circuitry 60 from and to the antenna 34 during a TDD time window. More specifically, when the control circuitry 64 is operating in the second TDD operational mode and during the receive portion of the TDD time window, reception of the RF receive signal RX is provided by the antenna 34 to antenna port 82. From the antenna port 82, the RF receive signal RX propagates to the multiplexer port 84-1, where the RF receive signal RX is routed by the circuitry in the IC package 54 to the coaxial cable 56. The RF receive signal RX propagates along the coaxial cable 56 to an RF port 86 of the RF transceiver circuitry 60. A receive chain within the RF transceiver circuitry 60 processes the RF receive signal RX.

When the control circuitry 64 is operating in the second TDD operational mode and during the transmit portion of the TDD time window, the transmission chain of the RF transceiver circuitry 60 generates the RF transmission signal TX from the RF port 78 and is then routed by the circuitry within the IC package 52 to the coaxial cable 58. The RF transmission signal TX propagates along the coaxial cable 58 to the IC package 54. The IC package 54 routes the RF transmission signal TX from the coaxial cable 58 to the multiplexer port 84-1. From the multiplexer port 84-1, the RF transmission signal TX propagates to the antenna port 82 and is then emitted by the antenna 34. Thus, by swapping between the first TDD operation mode and the second TDD operation mode, the antennas 34, 36 can be swapped. The control circuitry 64 may be configured to detect which of the antennas 34, 36 has the best radiation efficiency and swap between the antennas 34, 36 accordingly. In this manner, the RF transmission signal TX and the RF receive signal RX are transmitted and received using the one of the antennas 34, 36 having the greatest radiation efficiency.

As shown in FIG. 4, the IC package 52 of the RF front end circuitry 48 is in the top section 28 of the portable communication device 10. The IC package 52 includes an RF filter 88, a switchable path 90 configured to be opened and to be closed, a switchable path 92 configured to be opened and to be closed, a switchable path 94 configured to be opened and to be closed, a low noise amplifier (LNA) 96, and a power amplifier (PA) 98. The IC package 54 of the RF front end circuitry 48 is in the bottom section 30 of the portable communication device 10. The IC package 54 includes an RF filter 100, a switchable path 102 configured to be opened and to be closed, a switchable path 104 configured to be opened and to be closed, and an LNA 106.

With regard to the IC package 52, the RF filter 88 has a filter port FA1 and a filter port FA2. The RF filter 88 is configured to define a passband that includes the RF communication band of the RF receive signal RX and the RF transmission signal. Furthermore, the RF filter 88 is a symmetrical filter, and thus the passband is provided from the filter port FA1 to the filter port FA2 and from the filter port FA2 to the filter port FA1. Accordingly, the RF filter 88 is configured to pass the RF receive signal RX from the filter port FA1 to the filter port FA2 and is configured to pass the RF transmission signal TX from the filter port FA2 to the filter port FA1. The filter port FA1 is coupled to the multiplexer port 74-1 and thus to the antenna 36, while the filter port FA2 is coupled to the switchable path 90 and is coupled to the switchable path 92. More specifically, the switchable path 90 and the switchable path 92 are each connected to the common node CNA1, and the common node CNA1 is connected to the filter port FA2 of the RF filter 88. The RF filter 88 may be any type of RF filter such as a filter constructer from passive reactive components, an active RF filter, a surface acoustic wave (SAW) filter, a bulk acoustic wave (BAW) filter, and/or the like.

The LNA 96 has an input LNA port LIA and an output LNA port LOA. The switchable path 90 is connected between the filter port FA2 and the input LNA port LIA of the LNA 96. The output LNA port LOA is coupled to the RF port 76 of the RF transceiver circuitry 60. Thus, when the switchable path 90 is closed, the RF receive signal RX propagates through the switchable path 90 to the input LNA port LIA. The RF receive signal RX is then output from the LNA 96 at the output LNA port LOA to the RF port 76 of the RF transceiver circuitry 60 after amplification of the RF receive signal RX by the LNA 96. To provide amplification to the RF receive signal RX, the LNA 96 includes at least one low noise amplification component 108. In this manner, the LNA 96 is configured to provide amplification to the RF receive signal RX. The power regulation circuitry 66 may provide the low noise amplification component(s) 108 with a supply voltage that powers amplification.

Additionally, the LNA 96 includes an LNA filter 110. The LNA filter 110 has a passband that is specifically within the RF receive sub-band of the RF receive signal RX. Furthermore, the LNA filter 110 is configured to substantially match a source impedance presented at the output LNA port LOA with a load impedance presented at the output LNA port LOA from the RF port 76 of the RF transceiver circuitry 60. In this manner, very little noise is introduced into the RF receive signal RX by the LNA 96. The LNA filter 110 may be any type of RF filter such as a filter constructer from passive reactive components, an active RF filter, a SAW filter, a BAW filter, and/or the like.

The PA 98 includes an input PA port PI and an output PA port PO. The input PA port PI is coupled to the RF port 78 so as to receive the RF transmission signal TX from the RF transceiver circuitry 60. The output PA port PO is coupled to the switchable path 92 and is coupled to the switchable path 94. More specifically, the switchable path 92 and the switchable path 94 are coupled to one another at the common node CNA2. The common node CNA2 is connected to the output PA port PO. The switchable path 92 is thus connected between the output PA port PO and the filter port FA2 by being connected between the common node CNA1 and the common node CNA2. Furthermore, the switchable path 94 is connected between the output PA port PO and the coaxial cable 58. In this manner, when either the switchable path 92 or the switchable path 94 are closed, the PA 98 is configured to provide the RF transmission signal TX after amplification from the output PA port PO. More specifically, when the switchable path 92 is closed, the RF transmission signal TX propagates through the RF switchable path 92 after amplification to the filter port FA2. However, the RF transmission signal TX propagates through the switchable path 94 after amplification to the coaxial cable 58 and to the IC package 54. The PA 98 is thus coupled to drive the coaxial cable 58 when the switchable path 94 is closed. The PA 98 may be provided by one or more amplifier stages, where when more than one amplification stage is provided, the amplifier stages are cascoded with one another. The power regulation circuitry 66 may provide the PA 98 with one or more supply voltages in order to power amplification of the RF transmission signal TX.

As shown in FIG. 4, the IC package 54 of the RF front end circuitry 48 is in the bottom section 30 of the portable communication device 10. The IC package 54 includes an RF filter 100, a switchable path 102 configured to be opened and to be closed, a switchable path 104 configured to be opened and to be closed, and a low noise amplifier (LNA) 106.

With regard to the IC package 54, the RF filter 100 has a filter port FB1 and a filter port FB2. The RF filter 100 is configured to define a passband that includes the RF communication band of the RF receive signal RX and the RF transmission signal TX. Furthermore, the RF filter 100 is a symmetrical filter and thus the passband is provided from the filter port FB1 to the filter port FB2 and from the filter port FB2 to the filter port FB1. Accordingly, the RF filter 100 is configured to pass the RF receive signal RX from the filter port FB1 to the filter port FB2 and is configured to pass the RF transmission signal TX from the filter port FB2 to the filter port FB1. The filter port FB1 is coupled to the multiplexer port 84-1 and thus to the antenna 34, while the filter port FB2 is coupled to the switchable path 102 and is coupled to the switchable path 104. More specifically, the switchable path 102 and the switchable path 104 are each connected to the common node CNB, and the common node CNB is connected to the filter port FB2 of the RF filter 100. The RF filter 100 may be any type of RF filter, such as a filter constructer from passive reactive components, an active RF filter, a SAW filter, a BAW filter, and/or the like. In this manner, the switchable path 102 and the switchable path 104 are each coupled to the antenna 34.

The LNA 106 has an input LNA port LIB and an output LNA port LOB. The switchable path 102 is connected between the filter port FB2 and the input LNA port LIB of the LNA 106. The output LNA port LOB is coupled to the coaxial cable 56 of the RF transceiver circuitry 60. Thus, when the switchable path 102 is closed, the RF receive signal RX propagates through the switchable path 102 to the input LNA port LIB. After amplification by the LNA 106, the RF receive signal RX is then output from the LNA 106 at the output LNA port LOB to the coaxial cable 56. The LNA 106 is thus coupled to drive the coaxial cable 56. The RF receive signal RX propagates along the coaxial cable 56 to the RF port 86 of the RF transceiver circuitry 60. The coaxial cable 56 is thus coupled between the output LNA port LOB of the LNA 106 and the RF port 86 of the RF transceiver circuitry 60.

To provide amplification to the RF receive signal RX, the LNA 106 includes at least one low noise amplification component 112. In this manner, the LNA 106 is configured to provide amplification to the RF receive signal RX. The power regulation circuitry 66 may provide the low noise amplification component(s) 112 with a supply voltage that powers amplification.

Additionally, the LNA 106 includes an LNA filter 114. The LNA filter 114 has a passband that is specifically within the RF receive sub-band of the RF receive signal RX. Furthermore, the LNA filter 114 is configured to substantially match a source impedance presented at the output LNA port LOB with a load impedance presented at the output LNA port LOB from the RF port 86 of the RF transceiver circuitry 60. In this manner, very little noise is introduced into the RF receive signal RX by the LNA 106. The LNA filter 114 may be any type of RF filter, such as a filter constructer from passive reactive components, an active RF filter, a SAW filter, a BAW filter, and/or the like.

With regard to the switchable path 104 of the IC package 54, the switchable path 104 is connected between the filter port FB2 and the coaxial cable 58. The coaxial cable 58 is connected between the switchable path 94 in the IC package 52 and the switchable path 104 in the IC package 54. In this manner, when the switchable path 104 is closed, the RF transmission signal TX propagates through the coaxial cable 58 to the switchable path 94. Furthermore, when the switchable path 104 is closed, the RF transmission signal TX then propagates through the RF switchable path 104 to the filter port FB2. The RF transmission signal TX then passes through the RF filter 100 to the filter port FB1 and to the antenna 34.

Figure 5:
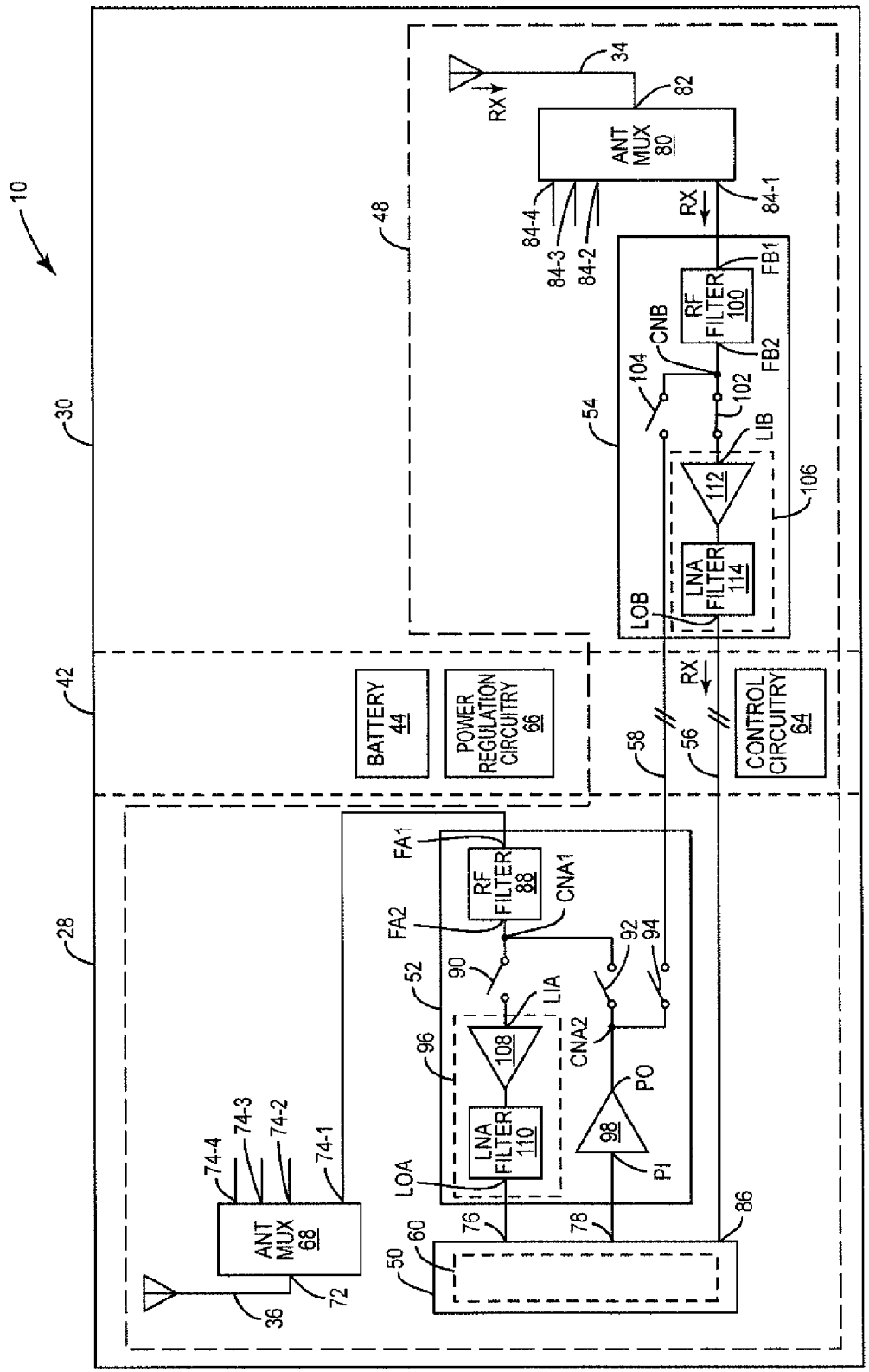
FIG. 5 illustrates the portable communication device shown in FIG. 4 during a receive portion of a TDD time window and using the antenna in the bottom section for reception of an RF receive signal.

FIG. 5 illustrates the portable communication device 10 shown in FIG. 4 during a receive portion of a TDD time window and using the antenna 34 for reception of the RF receive signal RX. The control circuitry 64 is thus provided to operate in the second TDD transmission mode, since the antenna 34 in the bottom section 30 is being utilized. The control circuitry 64 is thus configured to select the multiplexer port 84-1 of the antenna multiplexer 80. Thus, after reception by the antenna 34, the RF receive signal RX propagates from the antenna port 82 to the multiplexer port 84-1 of the antenna multiplexer 80. Furthermore, the RF receive signal RX then propagates to the filter port FB1 and is filtered by the RF filter 100. After the RF receive signal RX is filtered by the RF filter 100, the RF receive signal RX is output by the RF filter 100 from the filter port FB2.

The control circuitry is operable in the second TDD operation mode to close the switchable path 102 during a receive portion of the TDD time window, open the switchable path 104 during the receive portion of the TDD time window, open the switchable path 90 during the receive portion of the TDD time window, open the switchable path 92 during the receive portion of the TDD time window, and open the switchable path 94 during the receive portion of the TDD time window. In this manner, the RF receive signal RX is provided to the input LNA port LIB. The LNA 106 thus amplifies the RF receive signal RX and drives the coaxial cable 56 coupled to the output LNA port LOB of the LNA 106. The RF receive signal RX then propagates along the coaxial cable 56 which extends from the bottom section 30 to the top section 28. The RF transceiver circuitry 60 is configured to receive the RF receive signal RX from the coaxial cable 56 at the RF port 86.

Since the LNA 106 drives the coaxial cable 56, the RF receive signal RX prevents significant degradation of the RF receive signal RX. This reduces the sensitivity required by the RF transceiver circuitry 60 in order to process the RF receive signal RX because the RF receive signal RX has been strengthened by the amplification provided by the LNA 106. Furthermore, since the RF receive signal RX has been amplified by the LNA 106 in the bottom section 30, the insertion losses of the RF receive signal RX are significantly reduced. Accordingly, the IC package 54 in the bottom section 30 of the portable communication device 10 allows for the RF receive signal RX to be received by the antenna 34 in the bottom section 30 without experiencing significant degradation and insertion losses prior to reaching the RF transceiver circuitry 60 in the top section 32.

Figure 6:
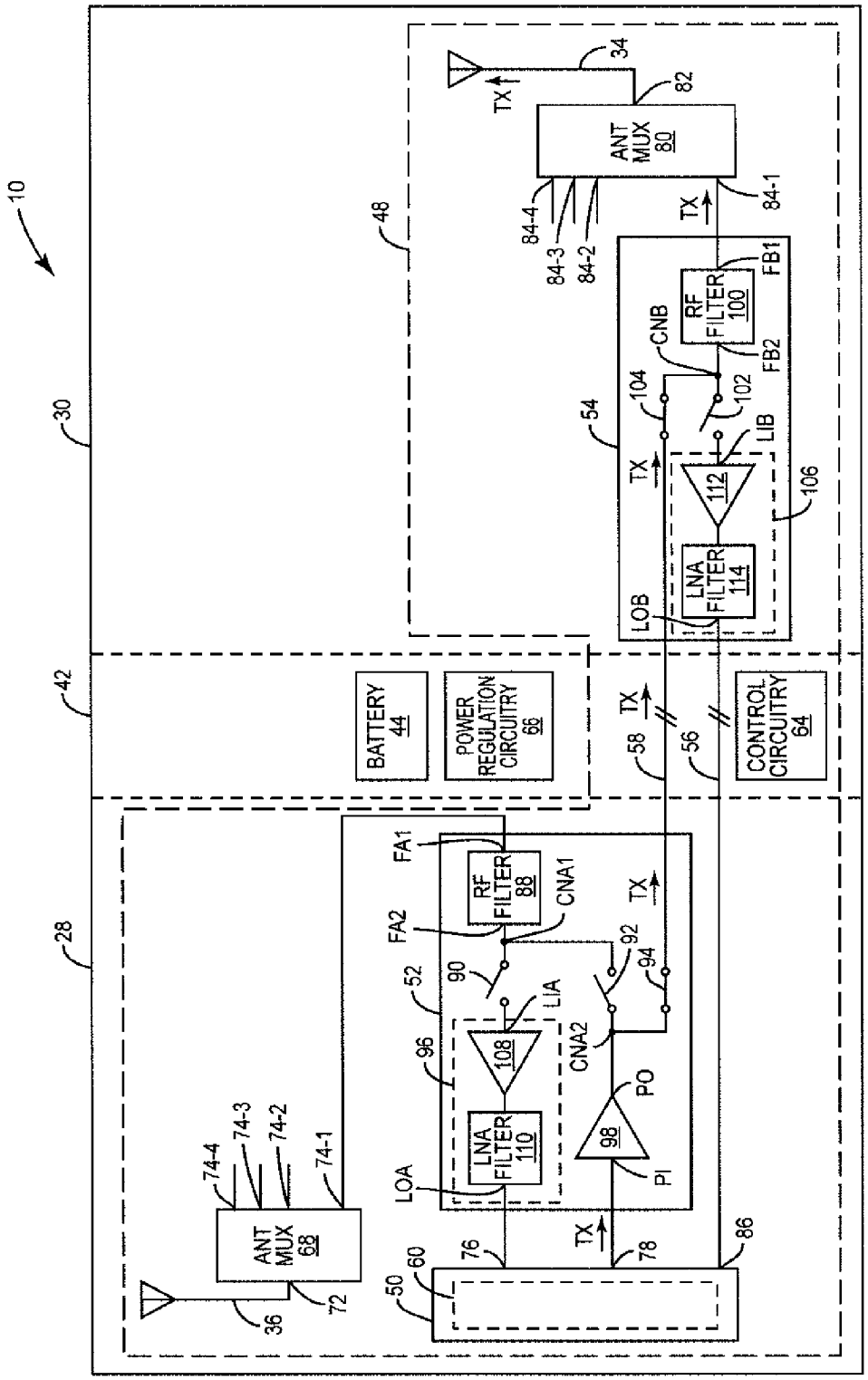
FIG. 6 illustrates the portable communication device shown in FIG. 4 during a transmit portion of the TDD time window and using the antenna in the bottom section for emission of an RF transmission signal.

FIG. 6 illustrates the portable communication device 10 shown in FIG. 4 during a transmit portion of the TDD time window and using the antenna 34 for emission of the RF transmission signal TX. The control circuitry 64 is thus provided to operate in the second TDD transmission mode, since the antenna 34 in the bottom section 30 is being utilized. The control circuitry 64 is thus configured to select the multiplexer port 84-1 of the antenna multiplexer 80. Furthermore, the RF transmission signal TX is generated by the RF transceiver circuitry 60 in the top section 28. The RF transmission signal TX is thus received by the PA 98 at the input PA port PI from the RF port 78 of the RF transceiver circuitry 60.

The control circuitry is operable in the second TDD operation mode to close the switchable path 94 during a transmit portion of the TDD time window, close the switchable path 104 during the transmit portion of the TDD time window, open the switchable path 90 during the transmit portion of the TDD time window, open the switchable path 92 during the transmit portion of the TDD time window, and open the switchable path 102 during the transmit portion of the TDD time window. In this manner, the RF transmission signal TX propagates though the switchable path 94 in the top section 28, the coaxial cable 58 that extends through the intermediate section, and the switchable path 104 in the bottom section 30. As such, the RF transmission signal TX is received at the filter port FB2 and is filtered by the RF filter 100. After filtering, the RF filter 100 outputs the RF transmission signal TX from the filter port FB1, which then propagates to the multiplexer port 84-1. The RF transmission signal TX then propagates to the antenna port 82 and is transmitted to the antenna 34 in the bottom section 30. The RF transmission signal TX is thereby emitted by the antenna 34 in the bottom section 30.

As demonstrated by FIG. 5 and FIG. 6, since the RF filter 100 passes the RF receive signal RX towards the RF transceiver circuitry 60 and then passes the RF transmission signal TX towards the antenna 34, the IC package 54 provides for a simplified switching topology in order to provide TDD reception and TDD transmission using the antenna 34 in the bottom section 30 of the portable communication device 10. This reduces insertion losses by reducing the loading effects of more complex switching and filtering topologies.

Figure 7:
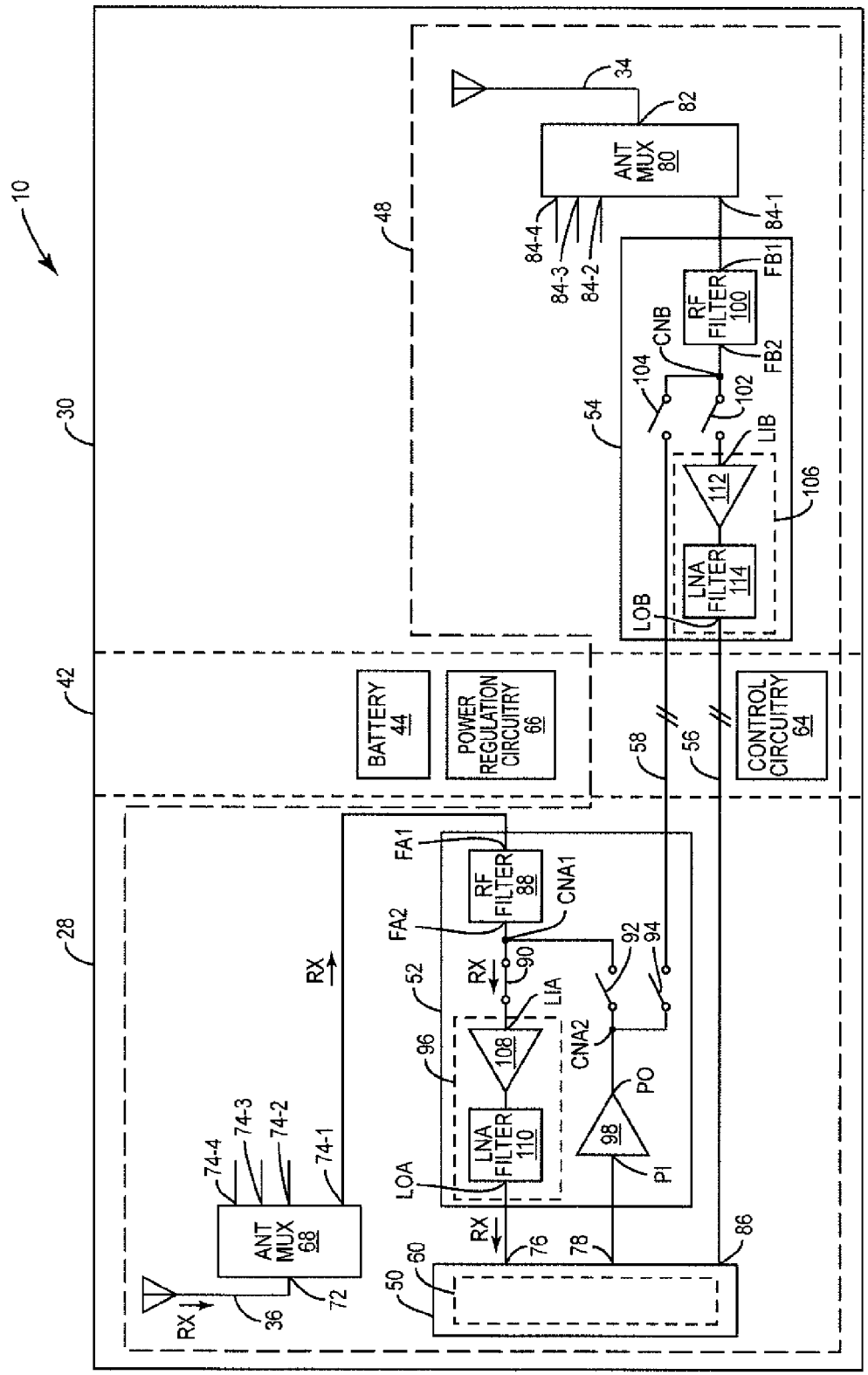
FIG. 7 illustrates the portable communication device shown in FIG. 4 during a receive portion of another TDD time window and using the antenna in the top section for reception of the RF receive signal.

FIG. 7 illustrates the portable communication device 10 shown in FIG. 4 during a receive portion of another TDD time window and using the antenna 36 for reception of the RF receive signal RX. The control circuitry 64 is thus provided to operate in the first TDD transmission mode since the antenna 36 in the top section 28 is being utilized. The control circuitry 64 is thus configured to select the multiplexer port 74-1 of the antenna multiplexer 68. Thus, after reception by the antenna 36, the RF receive signal RX propagates from the antenna port 72 to the multiplexer port 74-1 of the antenna multiplexer 68. Furthermore, the RF receive signal RX then propagates to the filter port FA1 and is filtered by the RF filter 88. After the RF receive signal RX is filtered by the RF filter 88, the RF receive signal RX is output by the RF filter 88 from the filter port FA2.

The control circuitry is operable in the first TDD operation mode to close the switchable path 90 during the receive portion of the TDD time window, open the switchable path 104 during the receive portion of the TDD time window, open the switchable path 94 during the receive portion of the TDD time window, open the switchable path 92 during the receive portion of the TDD time window, and open the switchable path 102 during the receive portion of the TDD time window. In this manner, the RF receive signal RX is provided to the input LNA port LIA. The LNA 96 thus amplifies the RF receive signal RX, which is provided from the output LNA port LOA of the LNA 96 after amplification. The RF transceiver circuitry 60 is configured to receive the RF receive signal RX from the output LNA port LOA of the LNA 96 at the RF port 76. Note that in this case, since the antenna 36 is in the top section 28, the RF receive signal RX is not propagated through any coaxial cable, such as the coaxial cables 56, 58.

Figure 8:
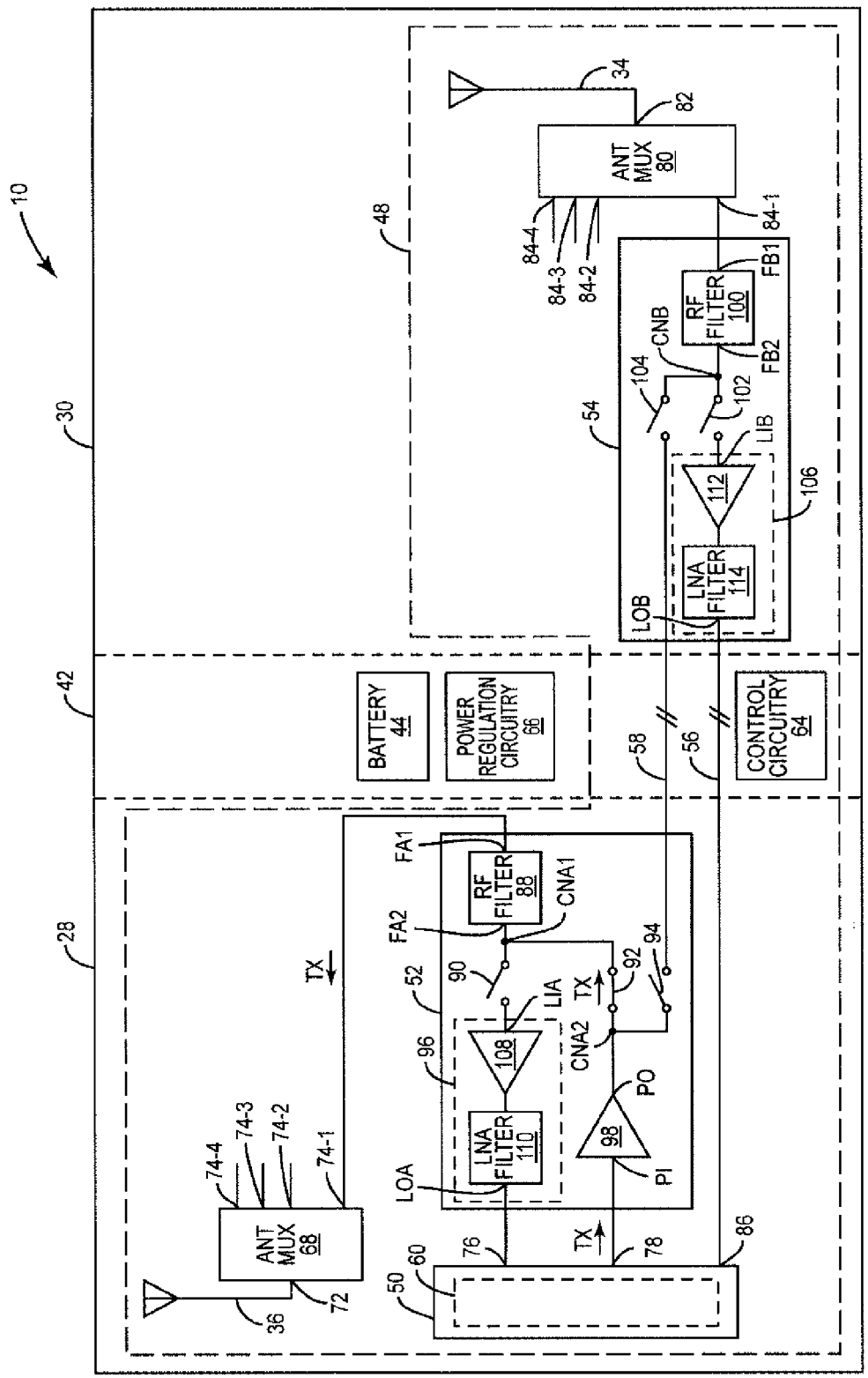
FIG. 8 illustrates the portable communication device shown in FIG. 4 during a transmit portion of the other TDD time window and using the antenna in the top section for emission of the RF transmission signal.

FIG. 8 illustrates the portable communication device 10 shown in FIG. 4 during a transmit portion of the other TDD time window and using the antenna 36 for emission of the RF transmission signal TX. The control circuitry 64 is thus provided to operate in the first TDD transmission mode, since the antenna 36 in the top section 28 is being utilized. The control circuitry 64 is thus configured to select the multiplexer port 74-1 of the antenna multiplexer 68. Furthermore, the RF transmission signal TX is generated by the RF transceiver circuitry 60 in the top section 28. The RF transmission signal TX is thus received by the PA 98 at the input PA port PI from the RF port 76 of the RF transceiver circuitry 60.

The control circuitry is operable in the first TDD operation mode to close the switchable path 92 during the transmit portion of the TDD time window, open the switchable path 90 during the transmit portion of the TDD time window, open the switchable path 94 during the transmit portion of the TDD time window, open the switchable path 102 during the transmit portion of the TDD time window, and open the switchable path 104 during the transmit portion of the TDD time window. In this manner, the RF transmission signal TX propagates though the switchable path 92 in the top section 28 from the output PA port PO after amplification of the RF transmission signal TX by the PA 98. Next, the RF transmission signal TX is received at the filter port FA2 and is filtered by the RF filter 88. After filtering, the RF filter 88 outputs the RF transmission signal TX from the filter port FA1, which then propagates to the multiplexer port 74-1. The RF transmission signal TX then propagates to the antenna port 72 and is transmitted to the antenna 36 in the top section 28. The RF transmission signal TX is thereby emitted by the antenna 36 in the top section 28.

As demonstrated by FIG. 7 and FIG. 8, since the RF filter 88 passes the RF receive signal RX towards the RF transceiver circuitry 60 and the passes the RF transmission signal TX towards the antenna 36, the IC package 52 provides for a simplified switching topology in order to provide TDD reception and TDD transmission using the antenna 36 in the top section 28 of the portable communication device 10. This reduces insertion losses by reducing the loading effects of more complex switching and filtering topologies.

Figure 9:
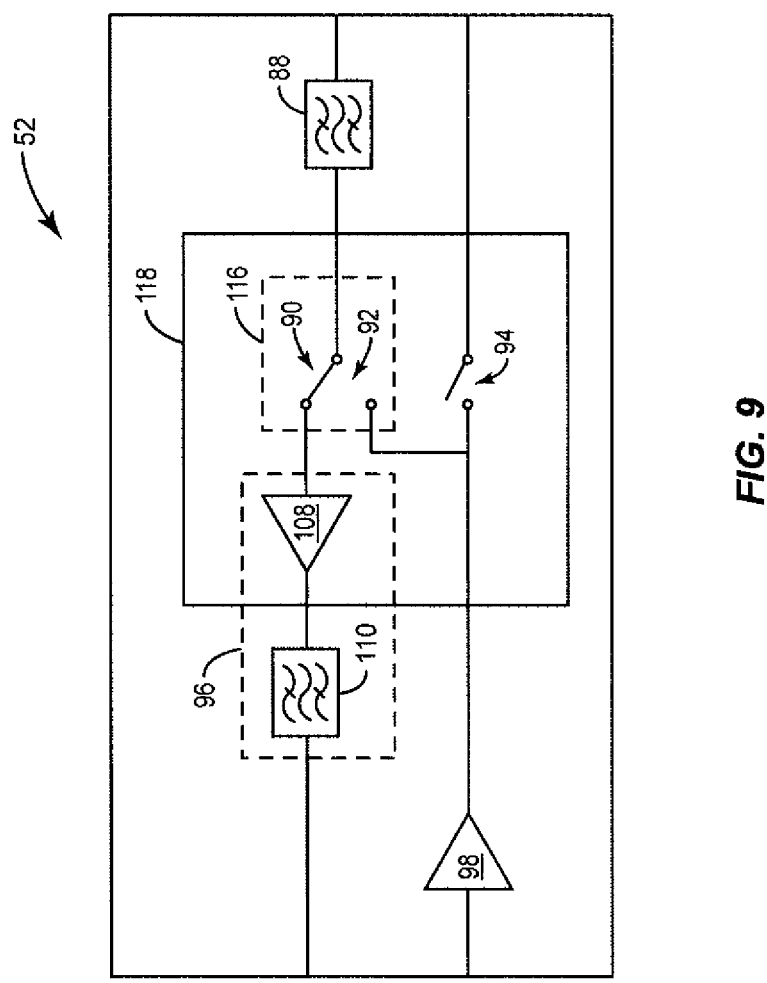
FIG. 9 illustrates one embodiment of the IC package shown in FIG. 3 that is in the top section.

FIG. 9 illustrates one embodiment of the IC package 52 shown in FIGS. 4-8 above. The IC package 52 shown in FIG. 9 includes embodiments of the RF filter 88, the switchable path 90, the switchable path 92, the switchable path 94, the LNA 96, and the PA 98, which are discussed above in FIG. 4-8. In this embodiment, the switchable path 90 and the switchable path 92 are provided by a single pole dual throw switch 116. The RF filter 88 is provided as a BAW filter, and the LNA filter 110 is provided as another BAW filter. The switchable path 90, the switchable path 92, the switchable path 94, and low noise amplification component(s) 108 of the LNA 96 are formed on a silicon-on-insulator semiconductor die 118 that are housed by the IC package 52.

Figure 10:
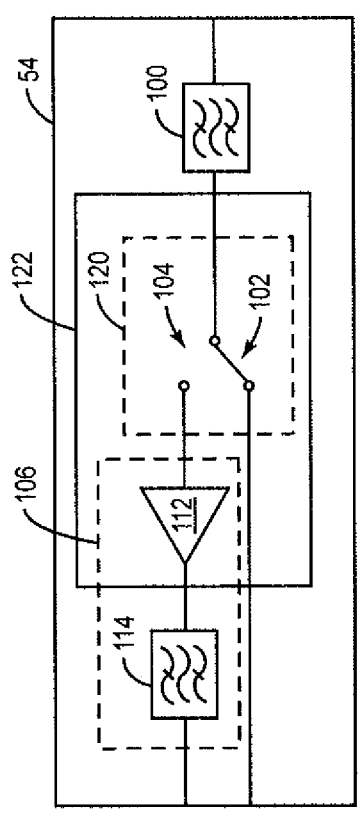
FIG. 10 illustrates one embodiment of the IC package shown in FIG. 3 that is in the bottom section.

FIG. 10 illustrates one embodiment of the IC package 54 shown above in FIGS. 4-8. The IC package 54 includes the RF filter 100, the switchable path 102, the switchable path 104, and the LNA 106. In this embodiment, the switchable path 102 and the switchable path 104 are provided by a single pole dual throw switch 120. The RF filter 100 is provided as a BAW filter, and the LNA filter 114 is provided as another BAW filter. The switchable path 102, the switchable path 104, and low noise amplification component(s) 114 of the LNA 96 are formed on a silicon-on-insulator semiconductor die 122 that are housed by the IC package 54.

Figure 11:
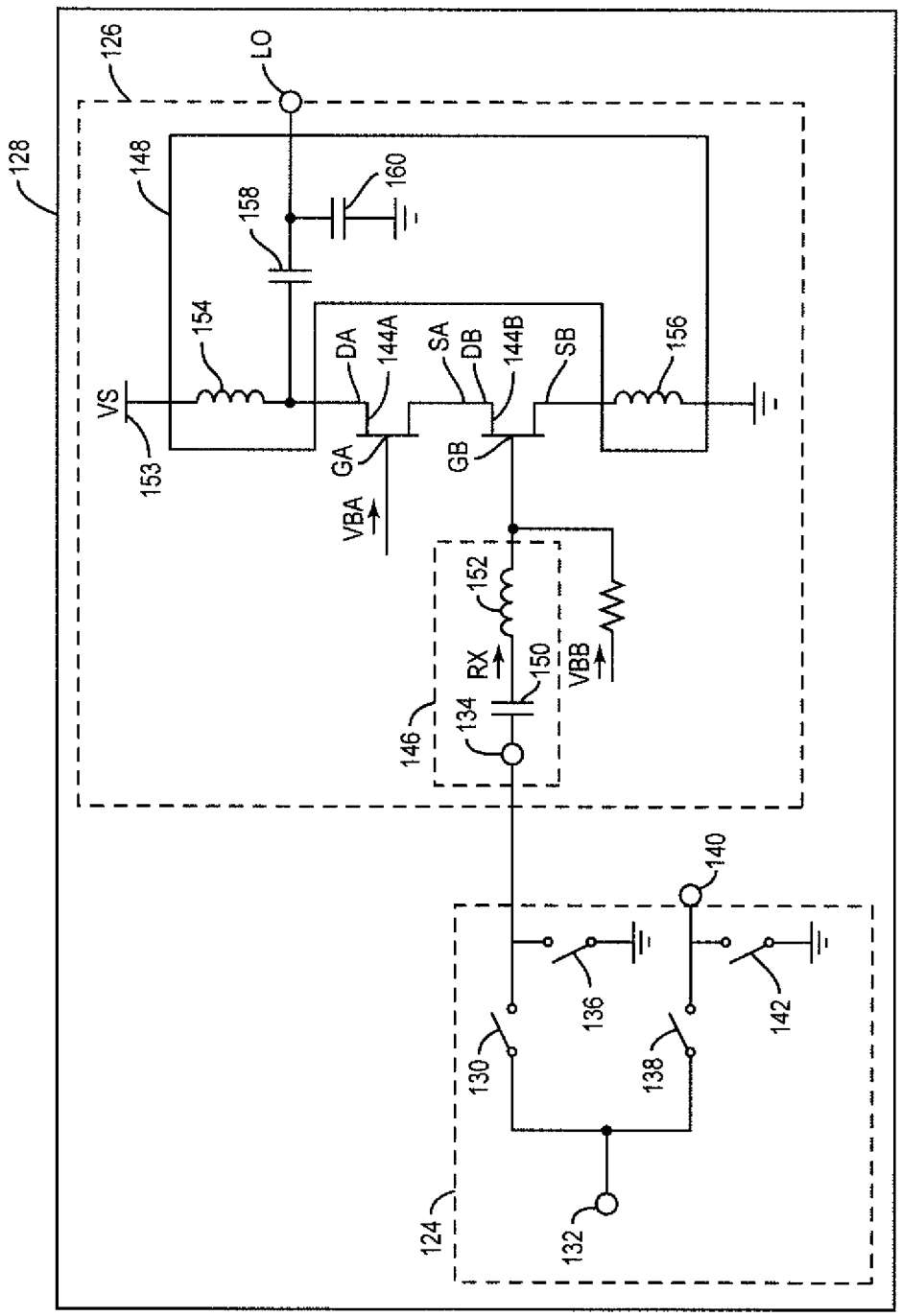
FIG. 11 illustrates an embodiment of a single pole dual throw switch and a low noise amplifier (LNA) each formed on a silicon-on-insulator semiconductor die, which may be utilized in the IC packages shown in FIG. 9 and in FIG. 10.

FIG. 11 illustrates another embodiment of a single pole dual throw switch 124 and an LNA 126 each formed on a silicon-on-insulator semiconductor die 128. The single pole dual throw switch 124 may be provided as an embodiment of the single pole dual throw switch 116 shown in FIG. 8 that provides the switchable path 90 and the switchable path 92 shown in FIG. 8 and/or may be provided as an embodiment of the single pole dual throw switch 116 shown in FIG. 8 that provides the switchable path 90 and the switchable path 120 shown in FIG. 9 that provides the switchable path 102 shown in FIG. 9 and the switchable path 104 shown in FIG. 9. The LNA 126 may be provided as the LNA 96 and/or the LNA 106 shown in FIG. 4-8.

In this embodiment, the single pole dual throw switch 124 includes a series switch 130 connected in series between a pole port 132 and a throw port 134, and a shunt switch 136 connected in shunt between the pole port 132 and the throw port 134. In this manner, to open the path between the pole port 132 and the throw port 134, the series switch 130 is turned off while the shunt switch 136 is turned on. To close the path between the pole port 132 and the throw port 134, the series switch 130 is turned on while the shunt switch 136 is turned off. The throw port 134 is the LNA input port of the LNA 126.

In this embodiment, the single pole dual throw switch 124 also includes a series switch 138 connected in series between the pole port 132 and a throw port 140 and a shunt switch 142 in shunt between the pole port 132 and the throw port 140. In this manner, to open the path between the pole port 132 and the throw port 140, the series switch 138 is turned off while the shunt switch 142 is turned on. To close the path between the pole port 132 and the throw port 140, the series switch 138 is turned on while the shunt switch 142 is turned off.

The LNA 126 includes low noise amplification components 144A, 144B, an input matching circuit 146, and an LNA filter 148. The input matching circuit 146 includes a capacitor 150 and an inductor 152 coupled in series to form a series resonator. The series resonator is coupled in series between the throw port 134 and the low noise amplification component 144B. In this embodiment, the low noise amplification component 144A is a field effect transistor (FET), and the low noise amplification component 144B is a FET. The FETs that provide the low noise amplification components 144A, 144B are stacked. More specifically, the low noise amplification component 144A includes a gate GA, a source SA, and a drain DA. The low noise amplification component 144B also includes a gate GB, a source SB, and a drain DB. The drain DA is coupled to a supply terminal 153 to receive a supply voltage VS. The gate GA is configured to receive a bias voltage VBA. The source SA is coupled to the drain DB. The gate DB is configured to receive the RF receive signal RX from the input matching circuit 146 after a bias signal VBB has been applied to the RF receive signal RX.

The LNA filter 148 is formed by the silicon-on-insulator semiconductor die 128. In this embodiment, the LNA filter 148 includes an inductor 154, an inductor 156, a capacitor 158, and a capacitor 160. The LNA filter 148 is configured to have a passband that includes the RF sub-band of the RF receive signal RX. The inductor 154 is connected in series between the supply terminal 153 and the drain DA. The inductor 156 is connected in series between the source SB and ground. The capacitor 158 is connected in series between the drain DA and an output LNA terminal LO. The capacitor 160 is connected in shunt with respect to the output LNA terminal LO between the capacitor 158 and the capacitor 160.

Figure 12:
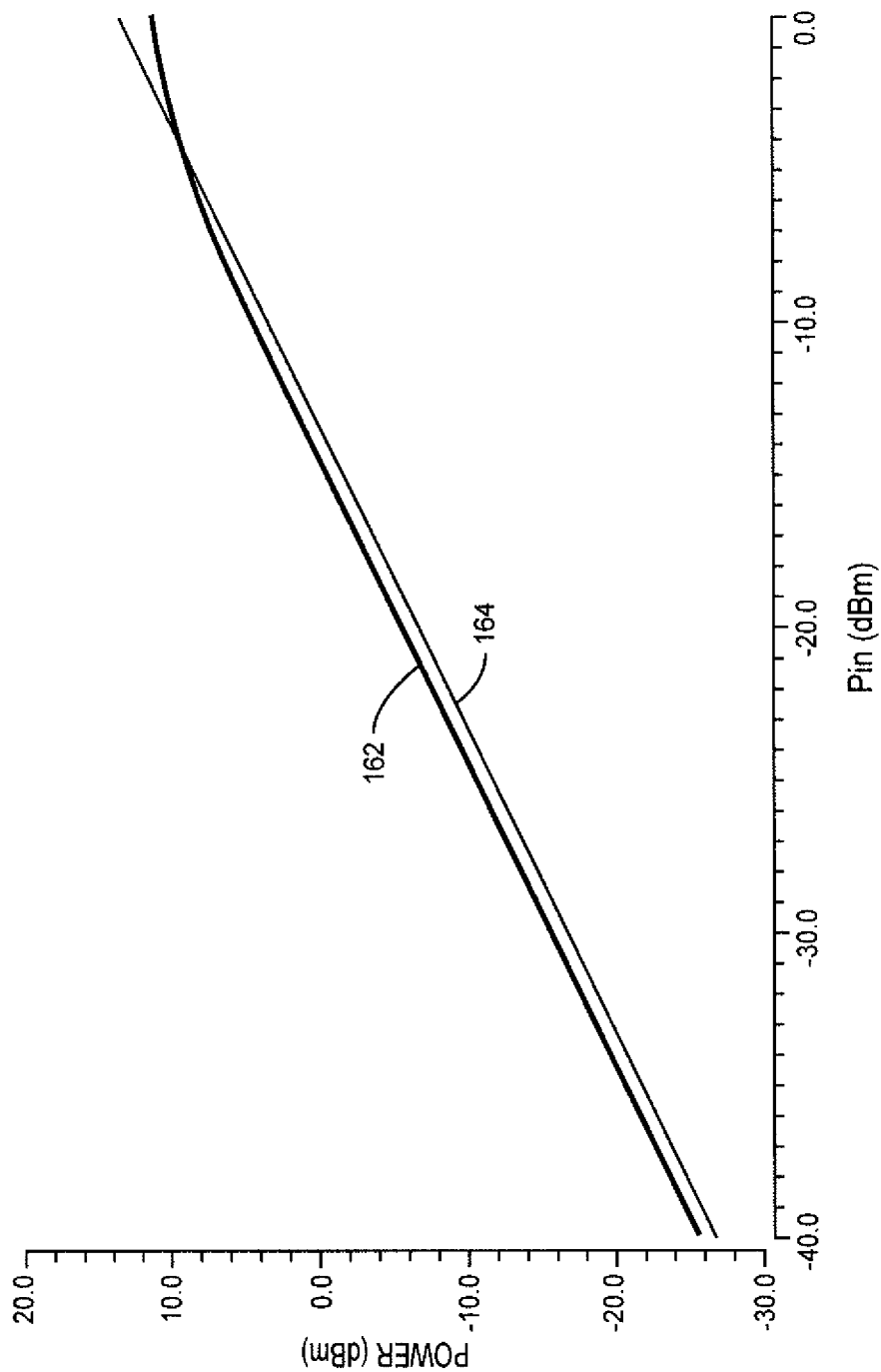
FIG. 12 illustrates compression curves that may be provided by the LNA shown in FIG. 11.

Referring now to FIGS. 11 and 12, FIG. 12 illustrates compression curves 162, 164 that may be provided by the LNA 126. The bias voltage VBB allows the LNA 126 to operate in a high linearity mode and in a low linearity mode. More specifically, the compression curve 162 is the result of the bias voltage VBB being provided so that the LNA 126 is operating in the low linearity mode. However, the compression curve 164 is the result of the bias voltage VBB being provided so that the LNA is operating in the high linearity mode.

Figure 13:
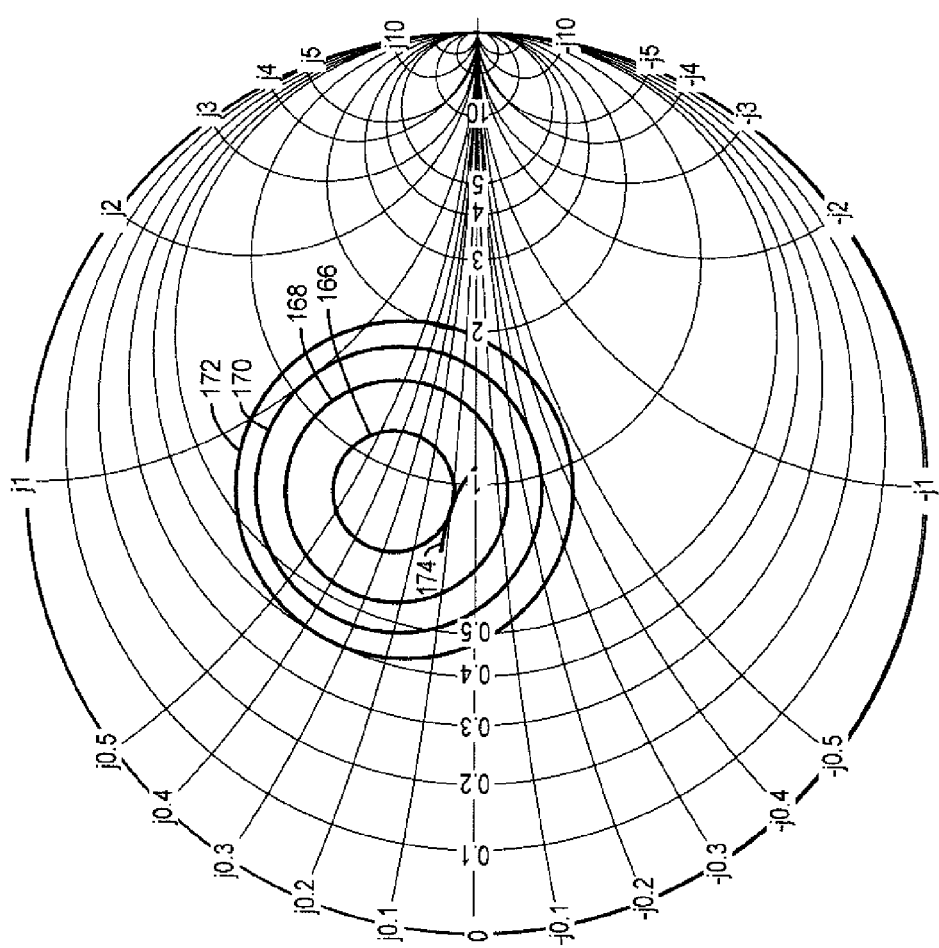
FIG. 13 is a Smith chart having impedance curves illustrating the impedance behavior of the LNA show in FIG. 11.

Referring now to FIGS. 11 and 13, FIG. 13 is a Smith chart having impedance curves 166, 168, 170, 172, 174 illustrating the impedance behavior of the LNA 126 show in FIG. 11. Each of the impedance curves 166, 168, 170, 172, 174 are provided with the RF receive signal RX having an operating frequency of approximately 3.5 GHz. The impedance curves 166, 168, 170, 172 are each provided by S21 responses with the load impedance at the output LNA terminal LO being varied. The impedance curve 174 is provided by an S11 response with the source impedance at the throw port 134 being varied. The impedance curve 166 is provided when the supply voltage VS has a voltage level of 1.5V. The impedance curve 168 is provided when the supply voltage VS has a voltage level of 1.6V. The impedance curve 170 is provided when the supply voltage VS has a voltage level of 1.7V. Finally, the impedance curve 172 is provided when the supply voltage VS has a voltage level of 1.8V.

As shown by FIG. 11, the LNA 126 is tied to the single pole dual throw switch 124 so as to compensate for the long path loss. The input matching circuit 146 and the LNA filter 148 also help protect the LNA 126 from external large blocker signal levels. The overall configuration allows various operations without the need to have additional filters.

Those skilled in the art will recognize improvements and modifications to the preferred embodiments of the present disclosure. All such improvements and modifications are considered within the scope of the concepts disclosed herein and the claims that follow.

What is claimed is:

1. A portable communication device, comprising:
   radio frequency (RF) transceiver circuitry comprising a first antenna;
   a first switchable receive path coupled to the first antenna and configured to be opened and to be closed;
   a first coaxial cable;
   a first low noise amplifier (LNA) having a first input LNA port and a first output LNA port, wherein the first LNA is coupled between the first switchable receive path and the first coaxial cable so the first input LNA port of the first LNA is coupled to the first switchable receive path and so that the first output LNA port of the first LNA is coupled to the first coaxial cable so that the first LNA drives the first coaxial cable;
   a first power amplifier (PA) having a first input PA port and a first output PA port, wherein the first input PA port is configured to receive an RF transmission signal from the RF transceiver circuitry at the first input PA port;
   a first switchable transmit path operable to be opened and closed, wherein the first switchable transmit path is coupled to the first output PA port of the first PA;
   a second switchable transmit path operable to be opened and closed, wherein the second switchable transmit path is coupled to the first antenna so that the RF transmission signal is transmittable by the first antenna when the first switchable transmit path and the second switchable transmit path are closed; and
   a second coaxial cable connected between the first switchable transmit path and the second switchable transmit path.

2. The portable communication device of claim 1 wherein:
   the first switchable receive path is operably associated with the first antenna so that an RF receive signal received from the first antenna is transmittable to the first input LNA port of the first LNA when the first switchable receive path is closed; and
   the RF transceiver circuitry is coupled to the first coaxial cable so that the RF transceiver circuitry is operable to receive the RF receive signal propagating along the first coaxial cable from the first output LNA port of the first LNA.

3. The portable communication device of claim 2 further comprising, a first RF filter having a first filter port coupled to the first antenna and a second filter port coupled to the first switchable receive path and the second switchable transmit path wherein:
   the first RF filter is configured to pass the RF receive signal from the first filter port to the second filter port; and
   the first RF filter is configured to pass the RF transmission signal from the second filter port to the first filter port.

4. The portable communication device of claim 1 further comprising:
   a second antenna;
   a second switchable receive path configured to be opened and to be closed, wherein the second switchable receive path is coupled to the second antenna; and
   a second LNA having a second input LNA port and a second output LNA port, wherein the second input LNA port of the second LNA is coupled to the second switchable receive path.

5. The portable communication device of claim 4 wherein:
   the first switchable receive path is operably associated with the first antenna so that an RF receive signal received from the first antenna is transmittable to the first input LNA port of the first LNA when the first switchable receive path is closed;
   the second switchable receive path is operably associated with the second antenna so that the RF receive signal received from the second antenna is transmittable to the second input LNA port of the second LNA when the second switchable receive path is closed;
   the RF transceiver circuitry is coupled to the first coaxial cable so that the RF transceiver circuitry is operable to receive the RF receive signal propagating along the first coaxial cable from the first output LNA port of the first LNA; and
   the RF transceiver circuitry is coupled to the second output LNA port so that the RF transceiver circuitry is operable to receive the RF receive signal from the second output LNA port of the second LNA.

6. The portable communication device of claim 4 further comprising a third switchable transmit path, wherein:
   the first input PA port is configured to receive the RF transmission signal from the RF transceiver circuitry at the first input PA port;

the first switchable transmit path is operable to be opened and closed, wherein the first switchable transmit path is coupled to the first output PA port of the first PA;

the second coaxial cable is connected between the first switchable transmit path and the second switchable transmit path;

the second switchable transmit path is operable to be opened and closed, wherein the second switchable transmit path is coupled to the first antenna so that the RF transmission signal is transmittable by the first antenna when the first switchable transmit path and the second switchable transmit path are closed; and the third switchable transmit path is operable to be opened and closed, wherein the third switchable transmit path is coupled to the second antenna so that the RF transmission signal is transmittable by the second antenna when the third switchable transmit path is closed.

7. The portable communication device of claim 6 further comprising a first RF filter and a second RF filter, wherein:
the first RF filter has a first filter port coupled to the first antenna and a second filter port coupled to the first switchable receive path and the second switchable transmit path;
the second RF filter having a third filter port coupled to the second antenna and a fourth filter port coupled to the second switchable receive path and the third switchable transmit path;
the first RF filter is configured to pass the RF receive signal from the first filter port to the second filter port;
the first RF filter is configured to pass the RF transmission signal from the second filter port to the first filter port;
the second RF filter is configured to pass the RF receive signal from the third filter port to the fourth filter port; and
the second RF filter is configured to pass the RF transmission signal from the fourth filter port to the third filter port.

8. The portable communication device of claim 7 wherein the RF receive signal has an first operating frequency and the RF transmission signal has a second operating frequency, wherein both the first operating frequency and the second operating frequency are within a frequency range of approximately 3.5 GHz to approximately 5.5 GHz.

9. The portable communication device of claim 7 wherein the portable communication device has a user interface side, a first edge side that borders the user interface side and a second edge side that borders the user interface surface, is substantially parallel to the first edge side, and is oppositely disposed to the first edge side, wherein:
a first section of the portable communication device is bordered by and is closer to the first edge side;
a second section of the portable communication device is bordered by and is closer to the second edge side such that the first section and the second section are oppositely disposed to one another;
the first antenna, the first switchable receive path, the second switchable transmit path, the first RF filter and the first LNA are provided in the first section of the portable communication device;
the second antenna, the RF transceiver circuitry, the first switchable transmit path, the third switchable transmit path, and the first PA are provided in the second section of the portable communication device; and
the first coaxial cable and the second coaxial cable extend between the first section and the second section of the portable communication device.

10. The portable communication device of claim 6 further comprising control circuitry configured to open and close the first switchable receive path, the second switchable receive path, the first switchable transmit path, the second switchable transmit path, and the third switchable transmit path.

11. The portable communication device of claim 10 wherein the control circuitry is operable in a first time division duplex (TDD) operation mode to:
close the first switchable receive path during a receive portion of a first TDD time window;
open the second switchable receive path during the receive portion of the first TDD time window;
open the first switchable transmit path during the receive portion of the first TDD time window;
open the second switchable transmit path during the receive portion of the first TDD time window; and
open the third switchable transmit path during the receive portion of the first TDD time window.

12. The portable communication device of claim 11 wherein the control circuitry is operable in the first TDD operation mode to:
open the first switchable receive path during a transmit portion of the first TDD time window;
open the second switchable receive path during the transmit portion of the first TDD time window;
close the first switchable transmit path during the transmit portion of the first TDD time window;
close the second switchable transmit path during the transmit portion of the first TDD time window; and
open the third switchable transmit path during the transmit portion of the first TDD time window.

13. The portable communication device of claim 12 wherein the control circuitry is operable in a second TDD operation mode to:
open the first switchable receive path during a receive portion of a second TDD time window;
close the second switchable receive path during the receive portion of the second TDD time window;
open the first switchable transmit path during the receive portion of the second TDD time window;
open the second switchable transmit path during the receive portion of the second TDD time window; and
open the third switchable transmit path during the receive portion of the second TDD time window.

14. The portable communication device of claim 13 wherein the control circuitry is operable in the second TDD operation mode to:
open the first switchable receive path during a transmit portion of the second TDD time window;
open the second switchable receive path during the transmit portion of the second TDD time window;
open the first switchable transmit path during the transmit portion of the second TDD time window;
open the second switchable transmit path during the transmit portion of the second TDD time window; and
close the third switchable transmit path during the transmit portion of the second TDD time window.

15. Radio frequency (RF) front end circuitry, comprising:
a first antenna;
a first switchable receive path configured to be opened and to be closed, wherein the first switchable receive path is coupled to the first antenna;
a first coaxial cable;
a first low noise amplifier (LNA) having a first input LNA port and a first output LNA port, wherein the first LNA is coupled between the first switchable receive path and the first coaxial cable so the first input LNA port of the first LNA is coupled to the first switchable receive path and so that the first output LNA port of the first LNA is coupled to the first coaxial cable so that the first LNA drives the first coaxial cable;

RF transceiver circuitry;

a first power amplifier (PA) having a first input PA port and a first output PA port, wherein the first input PA port is configured to receive an RF transmission signal from the RF transceiver circuitry at the first input PA port;

a first switchable transmit path operable to be opened and closed, wherein the first switchable transmit path is coupled to the first output PA port of the first PA;

a second switchable transmit path operable to be opened and closed, wherein the second switchable transmit path is coupled to the first antenna so that the RF transmission signal is transmittable by the first antenna when the first switchable transmit path and the second switchable transmit path are closed; and a second coaxial cable connected between the first switchable transmit path and the second switchable transmit path.

16. The RF front end circuitry of claim 15 wherein:

the first switchable receive path is operably associated with the first antenna so that an RF receive signal received from the first antenna is transmittable to the first input LNA port of the first LNA when the first switchable receive path is closed; and the RF transceiver circuitry is coupled to the first coaxial cable so that the RF transceiver circuitry is operable to receive the RF receive signal propagating along the first coaxial cable from the first output LNA port of the first LNA.

17. The RF front end circuitry of claim 16 further comprising a first RF filter having a first filter port coupled to the first antenna and a second filter port coupled to the first switchable receive path and the second switchable transmit path wherein:

the first RF filter is configured to pass the RF receive signal from the first filter port to the second filter port; and the first RF filter is configured to pass the RF transmission signal from the second filter port to the first filter port.

18. The RF front end circuitry of claim 15 further comprising:

a second antenna;

a second switchable receive path configured to be opened and to be closed, wherein the second switchable receive path is coupled to the second antenna; and a second LNA having a second input LNA port and a second output LNA port, wherein the second input LNA port of the second LNA is coupled to the second switchable receive path.

19. The RF front end circuitry of claim 18 wherein:

the first switchable receive path is operably associated with the first antenna so that an RF receive signal received from the first antenna is transmittable to the first input LNA port of the first LNA when the first switchable receive path is closed;

the second switchable receive path is operably associated with the second antenna so that the RF receive signal received from the second antenna is transmittable to the second input LNA port of the second LNA when the second switchable receive path is closed;

the RF transceiver circuitry is coupled to the first coaxial cable so that the RF transceiver circuitry is operable to receive the RF receive signal propagating along the first coaxial cable from the first output LNA port of the first LNA; and the RF transceiver circuitry is coupled to the second output LNA port so that the RF transceiver circuitry is operable to receive the RF receive signal from the second output LNA port of the second LNA.

20. The RF front end circuitry of claim 18 further comprising a third switchable transmit path, wherein:

the first input PA port is configured to receive the RF transmission signal from the RF transceiver circuitry at the first input PA port;

the first switchable transmit path is operable to be opened and closed, wherein the first switchable transmit path is coupled to the first output PA port of the first PA;

the second coaxial cable is connected between the first switchable transmit path and the second switchable transmit path;

the second switchable transmit path is operable to be opened and closed, wherein the second switchable transmit path is coupled to the first antenna so that the RF transmission signal is transmittable by the first antenna when the first switchable transmit path and the second switchable transmit path are closed; and the third switchable transmit path is operable to be opened and closed, wherein the third switchable transmit path is coupled to the second antenna so that the RF transmission signal is transmittable by the second antenna when the third switchable transmit path is closed.

21. The RF front end circuitry of claim 20 further comprising a first RF filter and a second RF filter, wherein:

the first RF filter has a first filter port coupled to the first antenna and a second filter port coupled to the first switchable receive path and the second switchable transmit path;

the second RF filter having a third filter port coupled to the second antenna and a fourth filter port coupled to the second switchable receive path and the third switchable transmit path;

the first RF filter is configured to pass the RF receive signal from the first filter port to the second filter port;

the first RF filter is configured to pass the RF transmission signal from the second filter port to the first filter port;

the second RF filter is configured to pass the RF receive signal from the third filter port to the fourth filter port; and the second RF filter is configured to pass the RF transmission signal from the fourth filter port to the third filter port.

* * * * *